United States Patent [19]

Kitamoto et al.

[11] 4,446,816
[45] May 8, 1984

[54] APPARATUS FOR MANUFACTURING A MAGNETIC RECORDING MEDIUM

[75] Inventors: Tatsuji Kitamoto; Ryuji Shirahata, both of Kanagawa, Japan

[73] Assignee: Fuji Photo Film Co., Ltd., Kanagawa, Japan

[21] Appl. No.: 475,674

[22] Filed: May 3, 1983

Related U.S. Application Data

[62] Division of Ser. No. 265,123, May 19, 1981, Pat. No. 4,395,439.

[30] Foreign Application Priority Data

May 20, 1980 [JP] Japan .................................. 55-66877

[51] Int. Cl.³ ............................................. C23C 13/08
[52] U.S. Cl. .................................. 118/718; 118/50.1; 118/720; 118/729; 118/500; 118/504
[58] Field of Search ...................... 118/718, 720, 50.1, 118/729, 500, 504

Primary Examiner—Bernard D. Pianalto

Attorney, Agent, or Firm—Sughrue, Mion, Zinn, Macpeak and Seas

[57] ABSTRACT

An apparatus for manufacturing a magnetic recording medium using vacuum-deposition from an evaporated metal source having a very high efficiency and uniform deposition. The support onto which the magnetic film is to be evaporated is guided and conveyed along a curved path above a molten metal evaporating source at a substantially constant speed. The curved path is shaped such that evaporated metal flow lines connecting a central point on the evaporation surface of the molten metal in the evaporating source to corresponding intersection points on the support form the same angle of incidence with respect to the longitudinal direction of the support for all positions along the support where the film is to be deposited. Endless belt structures including guide rollers and magnets are used to form rising and falling paths for conveying the support along the desired curved path.

16 Claims, 4 Drawing Figures

APPARATUS FOR MANUFACTURING A MAGNETIC RECORDING MEDIUM

This is a division of application Ser. No. 265,123, filed May 19, 1981, U.S. Pat. No. 4,395,439.

BACKGROUND OF THE INVENTION

The present invention relates to a so-called "oblique incidence vacuum deposition" method in which a magnetic material is applied by vacuum deposition obliquely to a flexible belt-shaped support being continuously conveyed to thereby manufacture a magnetic recording material.

Recently, as the demand for high-density magnetic recording has increased, instead of the conventional magnetic recording medium manufacturing method in which a binder type magnetic solution is coated on a flexible support and dried, a variety of non-coating system magnetic recording medium manufacturing methods in which, without using a binder, a ferromagnetic metal film layer is formed on a support by vacuum deposition, sputtering, ion plating, or the like have become of increased interest.

Among the non-coating magnetic recording medium manufacturing methods, an oblique incidence vacuum deposition method in which beams of evaporated magnetic metal are applied obliquely to the surface of a support so as to be desposited thereon has been found to be quite practical because the process is simple and the apparatus needed for implementing the method is relatively compact. Moreover, the method provides a magnetic film layer having excellent magnetic characteristics.

A specific feature of conventional oblique incidence vacuum deposition is that, while the support is being conveyed straightly or along the outer wall of a cylindrical drum, i.e. along a curved line, above the evaporating source, a ferromagnetic metal film is vacuum-deposited in one step on the support surface to a predetermined thickness by the evaporated metal beam from the evaporating source with the application (incident) angle of the beam being strictly limited. However, as the evaporated beam is oblique with respect to the support surface, the thickness of the vacuum-deposited metal film is equal to the cosine of the angle of incidence multiplied by the thickness of a vacuum-deposited metal film which would be formed with a zero incidence angle (where the evaporated metal beam forms a right angles with the support surface). Therefore, it is unavoidable that as the incident angle is increased, the efficiency of vacuum deposition is decreased. In addition, if the geometrical arrangement of the support and the evaporating source is such that the incident angle is increased, then the distance between the support and the evaporating source is correspondingly increased, and accordingly the efficiency of vacuum deposition is further decreased. Since the magnetic characteristics of the vacuum-deposited magnetic film depend on the incident angle (see, for example, Japanese Published Patent Application No. 352,558 - 1964), it is essential that the incident angle be as small as possible and that it be maintained unchanged during coating operations.

A low efficiency of vacuum deposition makes it difficult to decrease the manufacturing cost when relatively expensive nonferrous metal such as cobalt or cobalt alloy is used. Accordingly, this has been a serious problem requiring solution before the method can be put to practical use.

In order to solve the problem, for instance, as proposed in Japanese Patent Laid-Open Application No. 9607/1979, a method can be used in which the evaporating source is shifted from the position immediately below the drum so that only a high-density portion of the evaporated metal beam is applied to the surface of the support on the outer wall of the drum. Using this method, the efficiency of vacuum deposition is 20%.

However, with this method, it is difficult to increase the range of suitable evaporated metal beam incident angles with respect to the support on the outer wall of the drum. Accordingly, further improvement of the efficiency of vacuum deposition for a given evaporating source is limited. Further, the method must be significantly improved if the efficiency of vacuum deposition is to be made satisfactory. The method is also disadvantageous in that the resultant magnetic recording medium does not have uniform magnetic characteristics if an incident angle larger than a particular angle is used.

Accordingly, an object of the invention is to provide a magnetic recording medium manufacturing method in which all of the above-described problems relating to the efficiency of vacuum deposition of the conventional oblique incidence vacuum deposition method have been eliminated.

It is a further object of the invention to provide a method for manufacturing a magnetic recording medium having a high anti-magnetic force and high rectangular ratio.

SUMMARY OF THE INVENTION

The foregoing object and other objects of the invention have been achieved by the provision of a magnetic recording medium manufacturing method and apparatus in which, according to the invention, a flexible belt-shaped support is guided and run along a curved path in such a manner that, while the flexible belt-shaped support is being conveyed above a molten metal evaporating source substantially at a constant speed, evaporated metal flow lines connecting a central point of the evaporation surface of the molten metal evaporating source to corresponding intersecting points on the support form the same incident angle with respect to the longitudinal direction of the support at all times, wherein a magnetic film is efficienty and uniformly vacuum-deposited on the surface of the support.

DESCRIPTION OF THE PREFERRED EMBODIMENTS

A preferred embodiment of a method of manufacturing a magnetic recording medium will be described with reference to the accompanying drawings.

Figure 1:
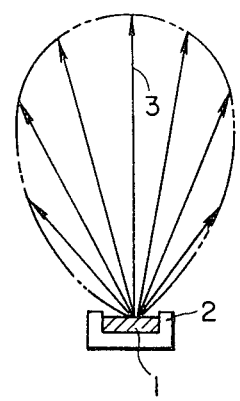
FIG. 1 is an explanatory diagram for a description of evaporating metal in an apparatus for practicing a method according to the invention.
Figure 2:
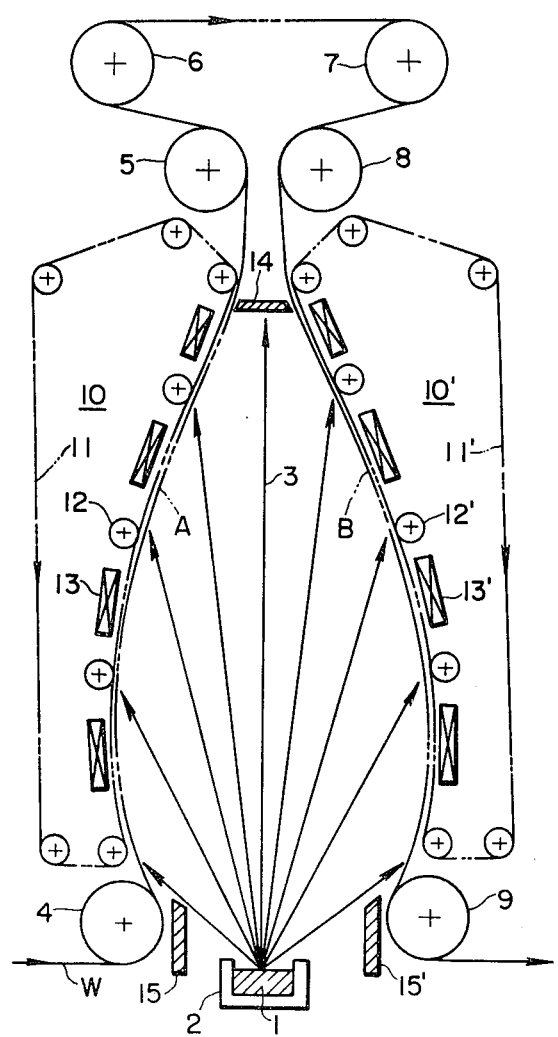
FIG. 2 is a schematic diagram showing essential parts of an apparatus for practicing the method of the invention.

FIGS. 1 and 2 show an apparatus for practicing the method of the invention. In FIG. 1, reference numeral 1 designates a supply of evaporated metal which is provided by scanning an electron beam onto a metal in a water-cooling copper hearth 2 which extends in the widthwise direction of a flexible belt-shaped support, web W. The metal vapor 1 diffuses and evaporates along evaporated metal flow lines as indicated by arrows 3 in FIG. 1. A specific feature of the method of the invention is that, while the web W is being guided in such a manner as to form a curved loop above the hearth 2, a metal film layer is formed on the lower surface, facing the hearth 2, of the web W.

A structure for guiding the web W along the curved loop is shown in FIG. 2. Guide rollers 4 through 9 are provided at points where the direction of run of the web W is to be changed with the guide rollers 4 through 9 directly supporting the web W. Among the guide rollers, the rollers 4 and 5 and the rollers 8 and 9 form a rising path A of the web W and a falling path B of the web W, respectively, which are symmetrical with respect to the hearth 2. Endless-belt shaped curve forming mechanisms 10 and 10' are provided between the rollers 4 and 5 and between the rollers 8 and 9, respectively.

Figure 4:
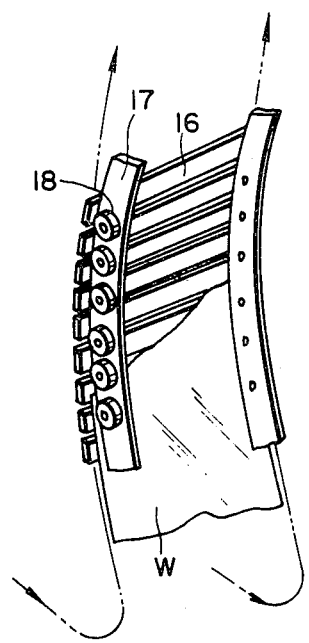
FIG. 4 is a perspective view showing an essential portion of another example of web transfer means.

The curve forming mechanism 10 and 10' have endless belts 11 and 11', respectively, each of which is formed as follows: Metal such as copper or aluminum is vacuum-deposited on the outer side of a plastic belt, on the inner side of which an iron film, a fine iron wire or iron powder is provided. The endless belts 11 and 11' thus formed are laid over a plurality of guide rollers 12 and 12', respectively. A plurality of magnets 13 and 13' are suitably disposed adjacent to the inner sides of portions of the endless belts 11 and 11' forming the above-described rising path A and falling path B of the web W, respectively. The magnets 13 and 13' continuously attract the endless belts 11 and 11' so that the belts curve along the rising path A and the falling path B, respectively. Each of the endless belts 11 and 11' may be replaced by a caterpillar-type belt which is provided by connecting a number of elongated iron plates. In case of the employment of the caterpillar-type belt, as shown in FIG. 4, it is also possible to guide the travel of the belts 16 along the rising path A and the falling path B in such a manner that each of the belts 16 at its surface confronting the evaporated metal flow lines is supported by means of a plurality of guide rollers 18 each rotatably supported to a pair of supporting plates 17. The both ends of each of the belts 16 are guided by these rollers 18.

The web W running along the curved rising path A and the curved falling path B is electrostatically charged by a glow discharge process or the like before it confronts the hearth 2. Therefore, the web W is electrostatically attracted to the outer sides of the endless belts 11 and 11' in the rising path A and the falling path B so that it is guided in the form of a curve.

Figure 3:
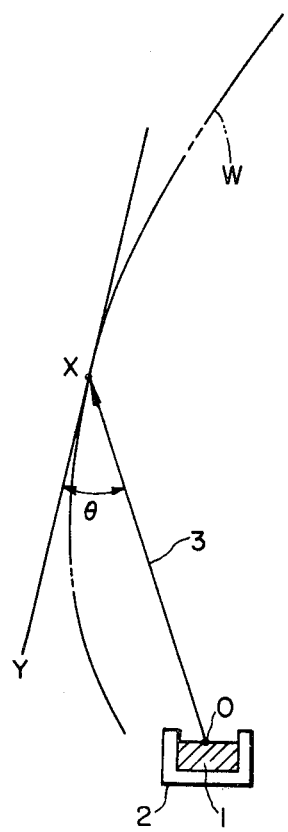
FIG. 3 is an enlarged view showing the relation between an evaporated metal flow line and curved web in FIG. 2.

The shape of the curve forming mechanisms 10 and 10' is determined as follows. As shown in FIG. 3, the evaporated metal flow line 3' connecting the central point O of the evaporation surface of the metal vapor 1 to a given point X on the web W along the rising path A (or the falling path B) forms an angle $\angle YXO$ with a line XY tangent to the point X. The curve forming mechanism is designed so that it conveys the web W with a curvature so as to maintain the angle $\angle YXO$ constant in the longitudinal direction of the web W.

In the regions where the lower portions of the rising path A and the falling path B are located and the two paths A and B come closest to each other, it is desirable that shielding masks 15 and 15' be provided between the hearth 2 and the guide roller 4 and between the hearth 2 and the guide roller 9, respectively, and that a shielding mask 14 be disposed between the guide rollers 5 and 8 in order to eliminate difficulties in deposition quality which can be caused if the density of evaporated metal flow lines of the evaporated metal 1 is excessively too small or in areas where it is difficult to curve the web W so that the above-described incident angle is maintained.

In the above-described method of the invention, while the web W is passing above the hearth 2 substantially at a constant speed, the web W is guided along the curves by the curve forming mechanisms 10 and 10' in such a manner that the evaporated metal flow lines connecting the central point O of the evaporation surface of the evaporated metal 1 in the hearth 2 to a given point on the web W form the same incident angle $\theta$ with respect to the longitudinal direction of the web W. With this construction, the efficiency of vacuum-deposition of the evaporated metal 1 is greatly improved and the resultant magnetic characteristic is uniform.

In order to confirm the efficiency of vacuum-deposition according to the method of the invention, first utilizing only the rising path A in FIG. 2, cobalt was vacuum-deposited on a conveyed polyester film of thickness 12 $\mu$m, and second utilizing both the rising path A and the falling path B, cobalt was vacuum-evaporated on the same film. In the former case, the efficiency of vacuum-deposition was 25% while in the latter case it was 52%.

The magnetic characteristics of a vacuum-deposited cobalt film formed according to a method proposed by Japanese Laid-Open Patent Application No. 9607/1979 among the above-described conventional methods, especially the anti-magnetic-force and rectangular ratio thereof, were compared with those of a vacuum-deposited cobalt film formed according to the above-described method of the invention. The anti-magnetic-force and the rectangular ratio of the film according to the conventional method were 850 Oe and 0.91, respectively, while those of the film according to the method of the invention were 900 Oe and 0.95. Thus, it has been confirmed that the method of the invention provides excellent magnetic characteristic.

In manufacturing a magnetic recording medium according to the vacuum deposition method of the invention, metal such as Fe, Co or Ni may be employed as a ferromagnetic metal to form a magnetic film, or ferromagnetic alloys such as Fe-Co, Fe-Ni, Co-Ni, Fe-Co-Ni, Fe-Rh, Fe-Cu, Co-Cu, Co-Au, Co-Y, Co-La, Co-Pr, Co-Gd, Co-Sm, Co-Pt, Ni-Cu, Mn-Bi, Mn-Sb, Mn-Al, Fe-Cr, Co-Cr, Ni-Cr, Fe-Co-Cr, or Fe-Co-Ni-Cr may be employed. The magnetic film should be thick enough to provide a sufficient output as a magnetic recording medium and thin enough for high density recording operations. Taking these considerations into account, in general, the thickness of the magnetic film should be in a range of from about 0.02 $\mu$m to 5.0 $\mu$m, preferably from 0.05 $\mu$m to 2.0 $\mu$m.

A plastic base support, for instance, of polyethylene terephthalate, polyimide, polyamide, polyvinyl chloride, cellulose triacetate, policarbonate or polyethylene naphthalate may be employed as the support W.

A resistance heating method, a laser beam heating method, a high frequency heating method or an electron beam heating method can be employed to heat the evaporation source in accordance with the invention. A method of feeding a linear material to the heating source may be employed to feed the evaporation material.

An apparatus for practicing the method of the invention has been described with reference to the case where both the rising path A and the falling path B are used simultaneously. However, if necessary, only one of the two paths A and B can be used.

What is claimed is:

1. An apparatus for manufacturing a magnetic recording medium comprising: a molten metal evaporating source; and means for transporting a flexible belt-shaped support above said evaporating source at a substantially constant speed along a curved path formed such that evaporated metal flow lines connecting a central point on an evaporation surface of said molten metal to said support form a substantially constant angle of incidence with respect to a longitudinal direction of said support throughout an area where said evaporated metal flow lines contact said support.

2. The apparatus of claim 1 wherein said transporting means comprises first and second guide rollers disposed upon either side of said source, third and fourth guide rollers disposed at upper positions along said curved path, and first and second endless-belt shape curve forming mechanisms disposed on opposite sides of said curved path.

3. The apparatus of claim 2 wherein said endless-belt shaped curve forming mechanisms each comprise an endless belt; a plurality of guide rollers for transporting said endless belt, said guide rollers being positioned so as to guide said endless belt along a predetermined portion of said curved path; and a plurality of magnets disposed within said endless belt for attracting said endless belt.

4. The apparatus of claim 3 wherein each of said endless belts comprises a plastic belt having a layer of metal vacuum deposited on an outer surface thereof and an iron film on an inner surface thereof.

5. The apparatus of claim 4 wherein said vacuum-deposited metal layer comprises a metal selected from the group consisting of copper and aluminum.

6. The apparatus of claim 4 wherein said iron layer comprises a material selected from the group consisting of iron film, fine iron wire and iron powder.

7. The apparatus of claim 3 further comprising means for electrostatically charging said flexible belt-shaped support wherein said support is electrostatically attracted to outer surfaces of said endless belts.

8. The apparatus of claim 3 further comprising first shielding masks disposed in areas closely adjacent said first and second rollers between said fisrt and second rollers and second shielding means provided at an upper position of said curved path below said third and fourth rollers and between upper portions of said endless belts for shielding said flexible belt-shaped support.

9. An apparatus for manufacturing a magnetic recording medium, comprising:
a molten metal evaporating source; and
means for transporting a flexible belt-shaped support relative to said evaporating source along a curved path formed such that evaporated metal flow lines connecting a central point on an evaporation surface of said molten metal to said support form a substantially constant angle of incidence with respect to a longitudinal direction of said support throughout an area where said evaporated metal flow lines contact said support.

10. The apparatus of claim 9 wherein said transporting means comprises first and second guide rollers disposed upon either side of said source, third and fourth guide rollers disposed at upper positions along said curved path, and first and second endless-belt shape curve forming mechanisms disposed on opposite sides of said curved path.

11. The apparatus of claim 10 wherein said endless-belt shaped curve forming mechanisms each comprise an endless belt; a plurality of guide rollers for transporting said endless belt, said guide rollers being positioned so as to guide said endless belt along a predetermined portion of said curved path; and a plurality of magnets disposed within said endless belt for attracting said endless belt.

12. The apparatus of claim 11 wherein each of said endless belts comprises a plastic belt having a layer of metal vacuum deposited on an outer surface thereof and an iron film on an inner surface thereof.

13. The apparatus of claim 12 wherein said vacuum-deposited metal layer comprises a metal selected from the group consisting of copper and aluminum.

14. The apparatus of claim 12 wherein said iron layer comprises a material selected from the group consisting of iron film, fine iron wire and iron powder.

15. The apparatus of claim 11 further comprising means for electrostatically charging said flexible belt-shaped support wherein said support is electrostatically attracted to outer surfaces of said endless belts.

16. The apparatus of claim 11 further comprising first shielding masks disposed in areas closely adjacent said first and second rollers between said first and second rollers and second shielding means provided at an upper position of said curved path below said third and fourth rollers and between upper portions of said endless belts for shielding said flexible belt-shaped support.

* * * * *